US008624256B2

(12) United States Patent
Kaitoh et al.

(10) Patent No.: US 8,624,256 B2
(45) Date of Patent: Jan. 7, 2014

(54) DISPLAY DEVICE

(75) Inventors: Takuo Kaitoh, Mobara (JP); Hidekazu Miyake, Mobara (JP); Takeshi Sakai, Kokubunji (JP); Terunori Saitou, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 50 days.

(21) Appl. No.: 12/219,900

(22) Filed: Jul. 30, 2008

(65) Prior Publication Data
US 2009/0050896 A1 Feb. 26, 2009

(30) Foreign Application Priority Data

Aug. 21, 2007 (JP) .................................. 2007-215006

(51) Int. Cl.
*H01L 27/14* (2006.01)
(52) U.S. Cl.
USPC ..................... 257/72; 257/59; 257/E33.053
(58) Field of Classification Search
USPC .................... 257/57, 59, 61, 66, 72, E33.053
See application file for complete search history.

(56) References Cited

U.S. PATENT DOCUMENTS

| 5,294,811 | A | 3/1994 | Aoyama et al. |
| 2004/0017365 | A1 | 1/2004 | Hatano et al. |
| 2007/0284580 | A1* | 12/2007 | Lim et al. ........................ 257/66 |
| 2008/0315204 | A1 | 12/2008 | Okada et al. |

FOREIGN PATENT DOCUMENTS

| JP | 5-55570 | 8/1991 |
| JP | 06-326314 | 11/1994 |
| JP | 10-229200 | 8/1998 |

* cited by examiner

*Primary Examiner* — Tucker Wright
(74) *Attorney, Agent, or Firm* — Stites & Harbison PLLC; Juan Carlos A. Marquez, Esq.; Nicholas B. Trenkle

(57) ABSTRACT

The present invention provides a display device which forms a drive circuit using a bottom-gate-type TFT made of poly-Si which generates a small leak current in a periphery of a display region. A gate electrode is made of Mo having a high melting point, and a gate insulation film is formed on the gate electrode. A channel layer constituted of a poly-Si layer is formed on the gate insulation film, and the poly-Si layer is covered with an a-Si layer. An n+Si layer is formed on the a-Si layer, and an SD electrode is formed on the n+Si layer. Although holes are induced in the poly-Si layer when a negative voltage (inverse bias) is applied to the gate electrode, the holes cannot pass through the a-Si layer and hence, no drain current flows. Accordingly, it is possible to realize a bottom-gate-type TFT using poly-silicon which generates a small leak current.

13 Claims, 9 Drawing Sheets

Prior Art    FIG. 10
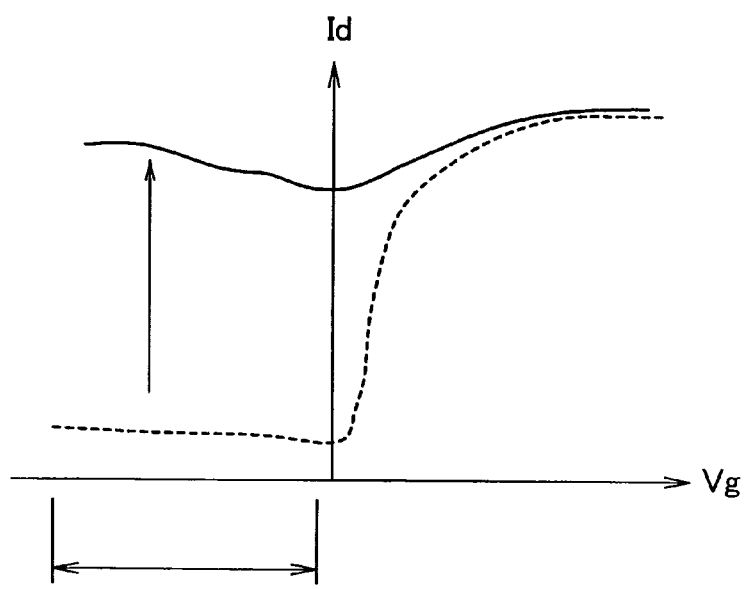
Prior Art    FIG. 11
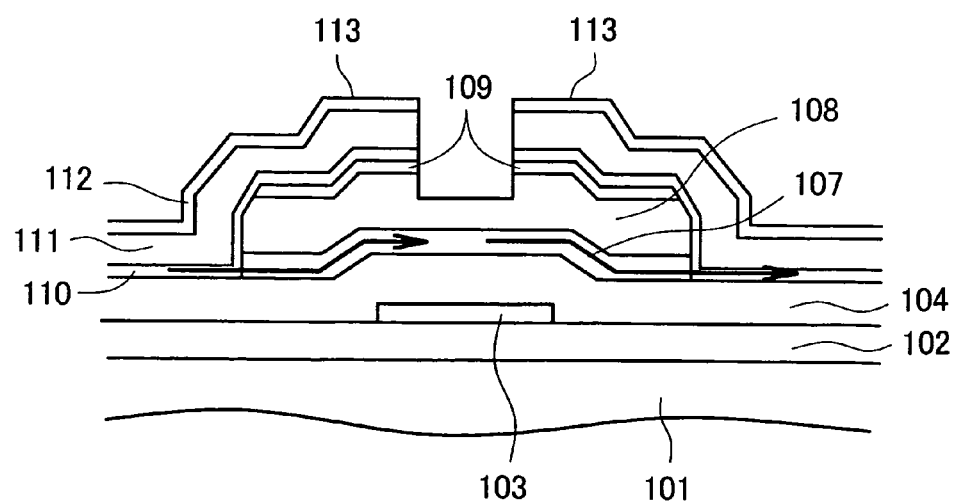

DISPLAY DEVICE

The present application claims priority from Japanese application JP2007-215006 filed on Aug. 21, 2007, the content of which is hereby incorporated by reference into this application.

BACKGROUND OF THE INVENTION

1. Field of the Invention

The present invention relates to a display device, and more particularly to an active-matrix-type display device which uses a-Si-type thin film transistors in a display region and forms a drive circuit which uses a poly-Si-type thin film transistor in a periphery of the display region.

2. Description of the Related Art

In a liquid crystal display device, on a TFT substrate on which pixel electrodes, thin film transistors (TFT) and the like are formed in a matrix array, a color filter substrate which forms color filters and the like thereon at positions corresponding to the pixel electrodes is arranged to face the TFT substrate in an opposed manner, and liquid crystal is sandwiched between the TFT substrate and the color filter substrate. An image is formed by controlling optical transmissivity of light passing through liquid crystal molecules for every pixel.

Data lines which extend in the longitudinal direction and are arranged parallel to each other in the lateral direction, and scanning lines which extend in the lateral direction and are arranged parallel to each other in the longitudinal direction are formed on the TFT substrate, and a pixel is formed in each region surrounded by the data lines and the scanning lines. The pixel is mainly constituted of a pixel electrode and a thin film transistor (TFT) which constitutes a switching element. A display region is formed of a large number of pixels formed in a matrix array in this manner.

Outside the display region, a scanning line drive circuit which drives the scanning lines and a data line drive circuit which drives the data lines are arranged. Conventionally, in the scanning line drive circuit and the data line drive circuit, an IC chip driver is mounted externally. The IC chip driver may be connected to the TFT substrate by a tape carrier method or the like or the IC driver may be directly mounted on the TFT substrate by a chip-on mounting method.

On the other hand, to satisfy a demand for the miniaturization of the whole display device while ensuring a display area or the like, a technique which forms a drive circuit using a TFT in a periphery of the display region has been developed. In such a display device, a TFT formed in a display region forms a channel portion using a-Si and a TFT formed in a drive circuit part forms a channel portion using poly-Si. That is, a-Si which exhibits a small leak current is used in the display region, and poly-Si which exhibits large electron mobility is used in the drive circuit part.

In general, the bottom gate structure is adopted in the TFT which uses a-Si, and the top gate structure is adopted in the TFT which uses poly-Si. Accordingly, it is necessary to form TFTs which have the different structures on one sheet of substrate and hence, the manufacturing process becomes complicated.

JP-A-5-55570 (patent document 1) discloses the constitution in which, for preventing the process from becoming complicated, a TFT which uses poly-Si also adopts the bottom gate structure. In such constitution, a poly-Si layer which becomes a channel is firstly formed on a gate insulation film formed on a gate electrode, and an a-Si layer is formed on the poly-Si layer. A contact layer formed of an n+ layer is formed on the a-Si layer, and source/drain electrodes (SD electrodes) are formed on the contact layer. By forming the TFT which forms the channel using poly-Si in such a manner, the number of steps which can be shared in common between the TFT which forms the channel using a-Si and the TFT which forms the channel using poly-Si is increased and hence, the manufacturing process can be simplified.

FIG. 9 shows the constitution of a TFT having a channel made of poly-Si in the same manner as the TFT described in patent document 1. In the technique disclosed in patent document 1, the poly-Si layer is formed on a gate insulation layer formed on a gate electrode 103, an a-Si layer is formed on the poly-Si layer, and an n+ layer is formed on the a-Si layer thus forming the contact layer. In such constitution, when the transistor is turned on, an ON current surely flows through the poly-Si layer which exhibits high mobility. However, when the transistor is turned off, there arises a drawback that an electric current leaks.

FIG. 9A is a plan view of the TFT, and FIG. 9B is a cross-sectional view taken along a line A-A in FIG. 9A. In FIG. 9A, a poly-Si layer 107 is formed on the gate electrode 103 with a gate insulation film 104 sandwiched therebetween, and an a-Si layer 108 is formed on the poly-Si layer 107. The SD electrode 113 is formed on the a-Si layer 108 by way of an n+Si layer 109.

FIG. 9B is the detailed cross-sectional view of the TFT shown in FIG. 9A. In FIG. 9B, the gate electrode 103 is formed on a background film 102, and the gate insulation film 104 is formed so as to cover the gate electrode 103. The poly-Si layer 107 is formed on the gate insulation film 104, and the a-Si layer 108 is formed on the poly-Si layer 107. The n+Si layer 109 is formed on the a-Si layer 108. Since the a-Si layer 108 and the n+Si layer 109 are formed by photolithography using the same mask, these layers have the same planar shape. The SD electrode 113 is formed on the n+Si layer 109. The SD electrode 113 is formed of a barrier metal layer 110 made of Mo, an Al layer 111, and a cap metal layer 112 made of Mo.

In the constitution shown in FIG. 9, there arises no drawback when an ON current is supplied to the TFT by applying a positive voltage to the gate electrode 103. However, when the TFT is turned off by applying a zero voltage or a negative voltage to the gate electrode 103, there arises a drawback. FIG. 10 shows the relationship between a gate voltage and a drain current of the TFT. The characteristic of the TFT is required to be set such that the drain current flows in the TFT when the positive voltage is applied to the gate electrode 103, and the drain current is cut off, that is, the drain current does not flow when the zero voltage or the negative voltage is applied to the gate electrode 103. A dotted line shown in FIG. 10 indicates the relationship between the gate voltage and the drain current of the generally-available TFT which uses a-Si. When the gate voltage reaches a certain value, the drain current is saturated and only a trivial leak current flows when the gate potential becomes zero or minus.

On the other hand, in the stacked structure formed of the poly-Si film and the a-Si film shown in FIG. 9A and FIG. 9B, there is observed a phenomenon that even when the gate electrode 103 is set at the zero potential or at the minus potential, the drain current is not cut. This implies that the TFT cannot play a role of a switching element. This phenomenon is considered to occur due to the following cause.

FIG. 11 is a cross-sectional view similar to the cross-sectional view shown in FIG. 9B. In FIG. 11, when the negative voltage is applied to the gate electrode 103, holes are induced in the poly-Si layer 107. No potential barrier exists between the poly-Si layer 107 and the barrier metal layer 110 of the SD electrode 113. Accordingly, the electric current generated by the holes directly flows into the SD electrode 113. Accordingly, the TFT is not turned off.

SUMMARY OF THE INVENTION

The present invention is provided to cope with such a phenomenon that the TFT is not turned off in the TFT having the active layer constituted by stacking the a-Si layer 108 and the poly-Si layer 107.

The present invention has been made to overcome the above-mentioned drawbacks and it is an object of the present invention to provide a technique which can, in a bottom-gate-type TFT which forms a channel portion using a poly-Si layer, prevent the poly-Si layer from coming into contact with an SD electrode of the TFT by forming an a-Si layer such that the a-Si layer covers the poly-Si layer. Specific constitutions of the TFT are as follows.

(1) In a display device which includes: a display region in which pixel electrodes and TFTs for pixel are formed in a matrix array; and a drive circuit which is formed in a periphery of the display region and includes a TFT for drive circuit, the TFT for pixel is a bottom-gate-type TFT having a channel portion which is formed of an a-Si layer, and the TFT for drive circuit is a bottom-gate-type TFT, the TFT for drive circuit is constituted by forming a channel portion using a poly-Si layer, by forming an a-Si layer which covers the poly-Si layer, by forming an n+Si layer on the a-Si layer, and by forming an SD electrode on the n+Si layer, and the poly-Si layer is not brought into contact with the SD electrode.

(2) In the display device having the constitution (1), the poly-Si layer is formed by applying laser annealing to the a-Si layer.

(3) In the display device having the constitution (1), a gate electrode of the bottom-gate-type TFT for the pixel and a gate electrode of the bottom-gate-type TFT for the drive circuit are made of Mo or Mo alloy.

(4) In the display device having the constitution (1), the SD electrode is constituted of a barrier metal layer, an Al layer and a cap metal layer, and the barrier metal and the cap metal are made of Mo or Mo alloy.

(5) In the display device having-the constitution (1), a portion of the poly-Si layer is not covered with the a-Si layer.

(6) In a display device which includes: a display region in which pixel electrodes and TFTs for pixel are formed in a matrix array; and a drive circuit which is formed in a periphery of the display region and includes a TFT for drive circuit, wherein the TFT for pixel is a bottom-gate-type TFT having a channel portion which is formed of an a-Si layer, and the TFT for drive circuit is a bottom-gate-type TFT, the TFT for drive circuit is constituted by forming a channel portion using a poly-Si layer, by forming an a-Si layer which covers the poly-Si layer, by forming an n+Si layer on an upper portion and a side portion of the a-Si layer, and by forming an SD electrode on the n+Si layer, and the poly-Si layer is not brought into contact with the n+Si layer.

(7) In the display device having the constitution (6), the poly-Si layer is formed by applying laser annealing to the a-Si layer.

(8) In the display device having the constitution (6), a gate electrode of the bottom-gate-type TFT for the pixel and a gate electrode of the bottom-gate-type TFT for the drive circuit are made of Mo or Mo alloy.

(9) In the display device having the constitution (6), the SD electrode is constituted of a barrier metal layer, an Al layer and a cap metal layer, and the barrier metal and the cap metal are made of Mo or Mo alloy.

(10) In the display device having the constitution (6), a portion of the poly-Si layer is not covered with the a-Si layer.

(11) In a liquid crystal display device which includes: a TFT substrate which forms a display region in which pixel electrodes and TFTs for pixel are formed in a matrix array and a drive circuit which includes a TFT for drive circuit in a periphery of the display region thereon; a color filter substrate which faces the TFT substrate in an opposed manner and forms color filters on portions thereof corresponding to the pixel electrodes; and liquid crystal which is sandwiched between the TFT substrate and the color filter substrate; wherein the TFT for pixel is a bottom-gate-type TFT having a channel portion which is formed of an a-Si layer, and the TFT for drive circuit is a bottom-gate-type TFT, the TFT for drive circuit is constituted by forming a channel portion using a poly-Si layer, by forming an a-Si layer which covers the poly-Si layer, by forming an n+Si layer on the a-Si layer, and by forming an SD electrode on the n+Si layer, and the poly-Si layer is not brought into contact with the SD electrode.

(12) In the liquid crystal display device having the constitution (11), aside portion of the a-Si layer is also covered with the n+Si layer.

(13) In the liquid crystal display device having the constitution (11), a portion of the poly-Si layer is not covered with the a-Si layer.

(14) In an organic EL display device which includes a TFT substrate which forms a display region in which organic EL layers and TFTs for pixel are formed in a matrix array and a drive circuit which includes a TFT for drive circuit in a periphery of the display region thereon, wherein the TFT for pixel is a bottom-gate-type TFT having a channel portion which is formed of an a-Si layer, and the TFT for drive circuit is a bottom-gate-type TFT, the TFT for drive circuit is constituted by forming a channel portion using a poly-Si layer, by forming an a-Si layer which covers the poly-Si layer, by forming an n+Si layer on the a-Si layer, and by forming an SD electrode on the n+Si layer, and the poly-Si layer is not brought into contact with the SD electrode.

(15) In the organic EL display device having the constitution (14), a side portion of the a-Si layer is also covered with the n+Si layer.

(16) In the organic EL display device having the constitution (14), a portion of the poly-Si layer is not covered with the a-Si layer.

(17) In a display device which includes: a display region in which pixel electrodes and TFTs for pixel are formed in a matrix array; and a drive circuit which is formed in a periphery of the display region and includes a TFT for drive circuit, the TFT for pixel is a bottom-gate-type TFT having a channel portion which is formed of an a-Si layer, and the TFT for drive circuit is a bottom-gate-type TFT, the TFT for drive circuit is constituted by forming a channel portion using a strip-shaped crystal silicon layer, by forming an a-Si layer which covers the strip-shaped crystal silicon layer, by forming an n+Si layer on the a-Si layer, and by forming an SD electrode on the n+Si layer, and the strip-shaped crystal silicon layer is not brought into contact with the SD electrode.

According to the present invention, in the bottom-gate-type TFT which forms the channel layer using the poly-Si layer, the a-Si layer is formed so as to cover the poly-Si layer thus preventing the direct contact between the poly-Si layer and the SD electrode and hence, it is possible to lower an OFF current of the TFT which forms the channel using the poly-Si layer to a practically usable level.

In this manner, according to the present invention, it is possible to form the TFT which forms the channel using the a-Si layer and the TFT which forms the channel using the poly-Si layer on one substrate without making the process complicated. Due to such constitution of the present invention, it is possible to manufacture a compact display device which ensures a fixed display region without largely pushing up a cost.

According to another aspect of the present invention, in a bottom-gate-type TFT which forms the channel layer using the poly-Si layer, the a-Si layer is formed so as to cover the poly-Si layer, the n+Si layer is formed on an upper portion and side portions of the a-Si layer, and the SD electrode is formed on the n+Si layer thus preventing the poly-Si layer and the n+Si layer from directly coming into contact with each other. Due to such constitution, it is possible to restrict an OFF current of the TFT which forms the channel layer using the poly-Si layer in the same manner as the TFT which forms the channel layer using the a-Si layer.

BRIEF DESCRIPTION OF DRAWINGS

FIG. 4A and FIG. 4B are schematic views of the TFT of an embodiment 1 according to the present invention, wherein FIG. 4A is a plan view and FIG. 4B is a cross-sectional view taken along a line A-A in FIG. 4A;

FIG. 7A and FIG. 7B are schematic views showing a TFT of an embodiment 2 according to the present invention, wherein FIG. 7A is a plan view and FIG. 7B is a cross-sectional view taken along a line A-A in FIG. 7A;

FIG. 8A and FIG. 8B are schematic views showing a TFT of an embodiment 3 according to the present invention, wherein FIG. 8A is a plan view and FIG. 8B is a cross-sectional view taken along a line A-A in FIG. 8A;

FIG. 9A and FIG. 9B are views of a conventional example of a bottom-gate-type TFT including a poly-Si layer, wherein FIG. 9A is a plan view and FIG. 9B is a cross-sectional view taken along a line A-A in FIG. 9A;

FIG. 10 is a graph showing the relationship between a gate voltage and a drain current of the TFT shown in FIG. 9; and FIG. 11 is a schematic view showing the manner of operation of a TFT of a conventional example.

DESCRIPTION OF THE PREFERRED EMBODIMENTS

Contents of the present invention are disclosed in detail in conjunction with embodiments.

[Embodiment 1]

Figure 1:
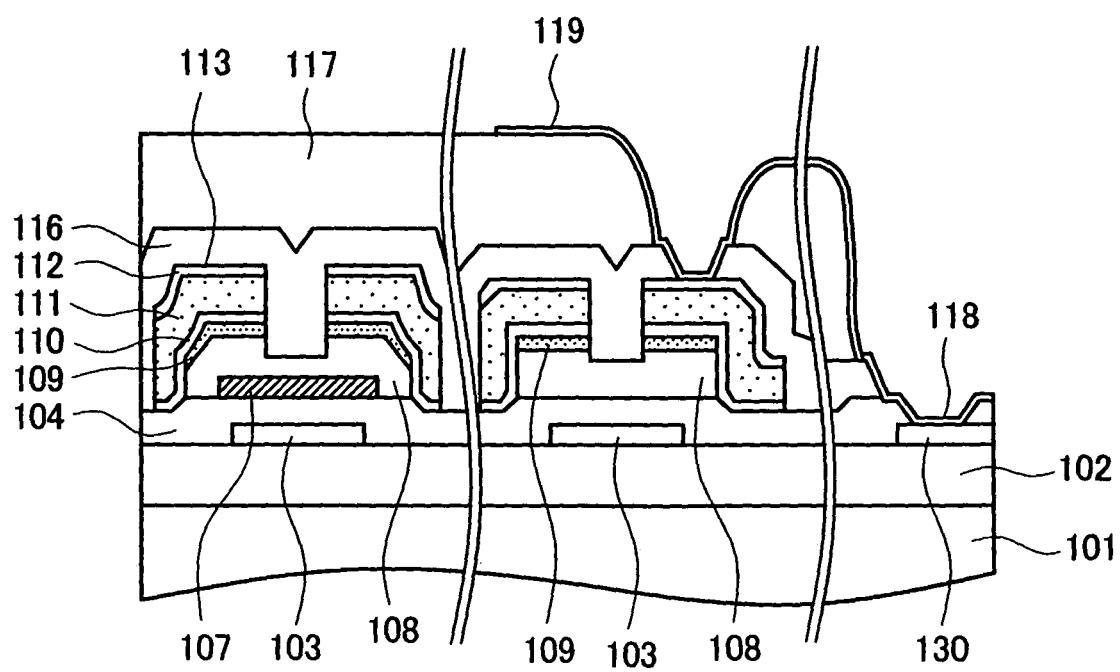
FIG. 1 is a schematic cross-sectional view showing an essential part of a display device according to the present invention.

FIG. 1 is a schematic cross-sectional view showing the constitution of an essential part of a display device of the present invention. In FIG. 1, a TFT described on a left side in the drawing is a TFT which is formed by stacking a poly-Si layer 107 and an a-Si layer 108 and is used for forming a drive circuit part (a TFT for drive circuit). A TFT described on a right side in the drawing is a TFT which is used for forming a pixel portion (a TFT for pixel). A terminal portion is formed on a right side of the TFT used for forming the pixel portion. In FIG. 1, for facilitating the comparison of the respective portions, the TFT for drive portion, the TFT for pixel portion and the terminal portion are described such that these portions are arranged close to each other. However, in an actual display device, the respective elements are formed on places remote from each other.

In FIG. 1, a background film 102 is formed on a TFT substrate 101. In this embodiment, although the background film 102 is formed of a single-layered SiN film, the background film 102 may be formed of a two-layered film constituted of an SiN film and an SiO2 film. Gate electrodes 103 are formed on the background film 102, and a gate insulation film 104 is formed on the gate electrodes 103 in a state that the gate insulation film 104 covers the gate electrodes 103. In the TFT for drive circuit part described on a left side in FIG. 1, a poly-Si layer 107 is formed on the gate insulation film 104. The poly-Si layer 107 constitutes a channel portion of the TFT. A film thickness of the poly-Si layer 107 is set to approximately 50 nm. An a-Si-layer 108 is formed on the poly-Si layer 107 in a state that the a-Si layer 108 covers the poly-Si layer 107. A film thickness of the a-Si layer 108 is set to approximately 150 nm.

In the present invention, not only is the a-Si layer 108 placed on the poly-Si layer 107 but also the a-Si layer 108 completely covers the poly-Si layer 107. In this manner, the a-Si layer 108 completely covers the poly-Si layer 107 and hence, as described later, a leak current generated in the poly-Si TFT can be restricted to a level substantially equal to a level of a leak current generated in the a-Si TFT. An n+Si layer 109 is formed on the a-Si layer 108 and is brought into contact with an SD electrode 113.

The SD electrode 113 is constituted of a barrier metal 110 made of Mo, an Al film and a cap metal 112 made of Mo. The whole TFT is protected by a passivation film 116 formed of an SiN film. On the passivation film 116, a leveling film formed of an organic film 117 is formed for leveling portions where pixel electrodes are formed.

In FIG. 1, the TFT used for forming the pixel portion is described on a right side of the TFT for drive circuit part. The TFT for pixel portion adopts the same structure as the TFT for drive circuit part except for that a channel portion is not formed of a poly-Si layer 107. That is, the TFT for drive circuit part requires a high-speed operation and hence, poly-Si which exhibits high electron mobility is used for forming the channel portion. On the other hand, the TFT for pixel portion does not require a high-speed operation comparable to an operation of the TFT for drive circuit part and hence, a-Si is used for forming the channel portion.

The SD electrode 113 of the TFT for pixel portion is made electrically conductive with the pixel electrode for supplying a data signal to the pixel portion. That is, a through hole is formed in the passivation film 116 which covers the TFT for pixel portion and the leveling film formed of the organic film 117, and the pixel electrode and the SD electrode 113 are made electrically conductive with each other through the through hole. The pixel electrode is formed of an ITO film 119 which is a transparent conductive film.

In FIG. 1, the terminal portion is described on a right side of the TFT for pixel portion. Terminal-portion lines 130 in FIG. 1 are formed on the same layer as the gate electrodes 103. That is, the terminal-portion lines 130 are simultaneously formed with the gate electrodes 103 using the same material. The terminal-portion lines 130 are protected by the passivation film 116 and the leveling film. In the terminal portion, terminal portion contact holes 118 are formed in the passivation film and the leveling film for connecting the terminal portion to an external circuit.

The terminal-portion lines 130 are made of metal and hence, the terminal-portion lines 130 are liable to be easily corroded attributed to an external environment. To prevent the terminal-portion lines 130 from being corroded, the terminal portion is covered with the ITO film 119 which is a transparent conductive film. The ITO film 119 is made of metal oxide and hence, the ITO film 119 is chemically stable. The ITO film 119 formed on the terminal portion is simultaneously formed with the ITO film 119 which forms the pixel electrodes.

Figure 2A:
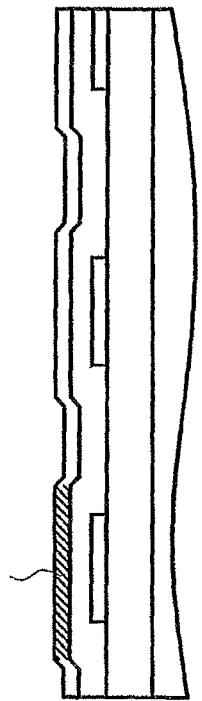
FIG. 2A to FIG. 2F are views showing steps of a process for forming a TFT according to the present invention.

FIG. 2A to FIG. 2F show a process for forming the TFTs and the terminal portion shown in FIG. 1. In FIG. 2A, an SiN film which becomes the background film 102 is formed on the TFT substrate 101 using a plasma CVD method. Thereafter, a wiring layer for forming the gate electrodes 103 is formed by sputtering, and the wiring layer is processed in a photolithography step. By taking a laser annealing step which follows the photolithography step into consideration, the gate electrode 103 is made of a material having a high melting point (Mo system).

Figure 2B:
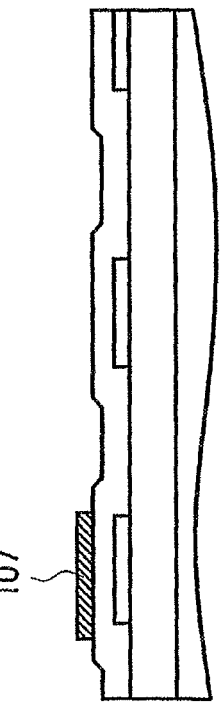
Figure 2C:
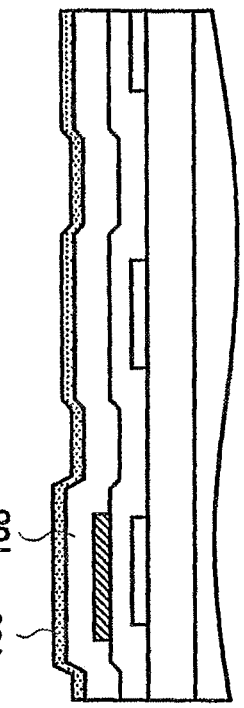

In FIG. 2B, an SiO2 film which becomes the gate insulation film 104 is formed using a plasma CVD method. Subsequently, an a-Si film is formed using a plasma CVD method. The a-Si film is converted into a poly-Si film by applying laser annealing. To apply laser annealing to the a-Si film, a dehydrogenation treatment (annealing treatment at a temperature of 450° C. or more) is applied to the a-Si film for removing hydrogen in the a-Si film. In FIG. 2C, a-Si is converted into poly-Si using a continuously oscillating solid laser 106. Here, depending on radiation conditions of the laser, it is possible to form a strip-shaped crystal silicon layer in which a crystal grains are largely grown in the scanning direction of the laser. By changing the strip direction of the strip-shaped crystal silicon layer in the channel direction of the transistor, it is possible to acquire the TFT which exhibits high mobility.

Figure 2D:
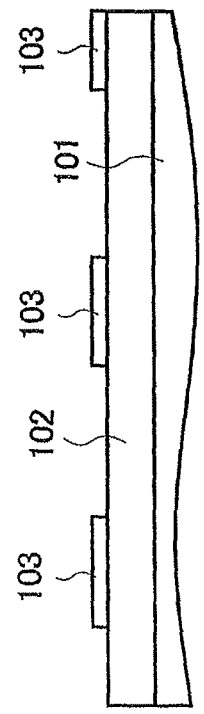
Figure 2E:
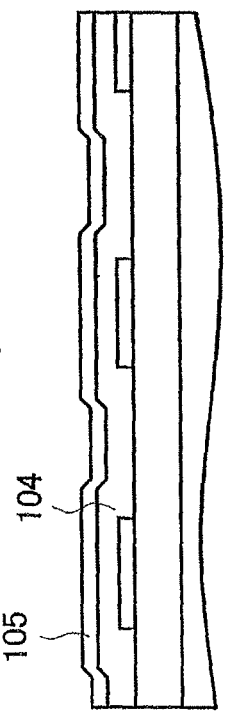

As shown in FIG. 2D, a portion to which the laser beams are radiated is formed into the poly-Si layer 107. Although the laser beams are deemed to be radiated to only one TFT in FIG. 2C and FIG. 2D, in an actual operation, the laser beams are simultaneously radiated to a large number of TFTs for drive circuit part which constitute a drive portion. By making the poly-Si layer 107 formed in this manner subject to a photolithography step and an etching step as shown in FIG. 2E, the channel portion formed of the poly-Si layer 107 is formed.

Figure 2F:
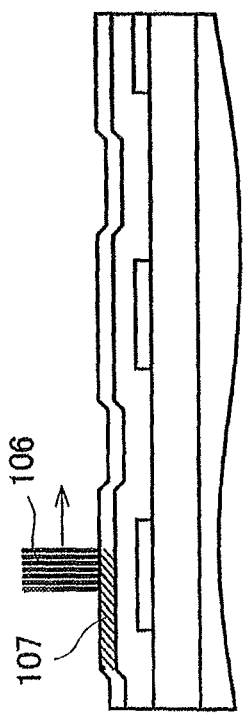
Figure 3J:
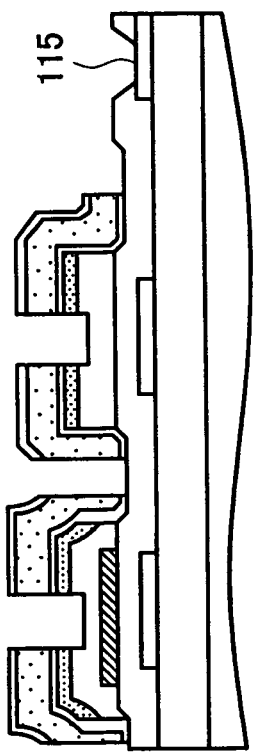
FIG. 3G to FIG. 3K are views showing steps of the process for forming the TFT succeeding to the steps shown in FIG. 2A to FIG. 2F.

Next, as shown in FIG. 2F, the a-Si layers 108 are formed on the poly-Si layer 107 in a state that the a-Si layer 108 covers the poly-Si layer 107 using a plasma CVD method. On the a-Si layer 108, an n+Si layer 109 doped with phosphor is formed using a plasma CVD method for bringing the a-Si layer 108 and the SD electrode 113 into contact with each other. Thereafter, as shown in FIG. 3G, the n+Si layer 109 and the a-Si layer 108 are processed in a photolithography step and an etching step.

Next, SD electrode layers 113 are formed. The SD electrode layers 113 are formed in the same layer as data signal lines, and are simultaneously formed with the data signal lines. As shown in FIG. 3H, the SD electrode layer 113 is formed of three layers consisting of the barrier metal layer 110, the Al layer 111 and the cap metal layer 112. The barrier metal layer 110 and the cap metal layer 112 are made of Mo. Although the electrical connection of the SD electrode 113 is mainly acquired by Al, Mo is provided for preventing hillock of Al and for preventing the defective connection attributed to oxidization of Al when Al is brought into contact with the ITO film 119.

Figure 3K:
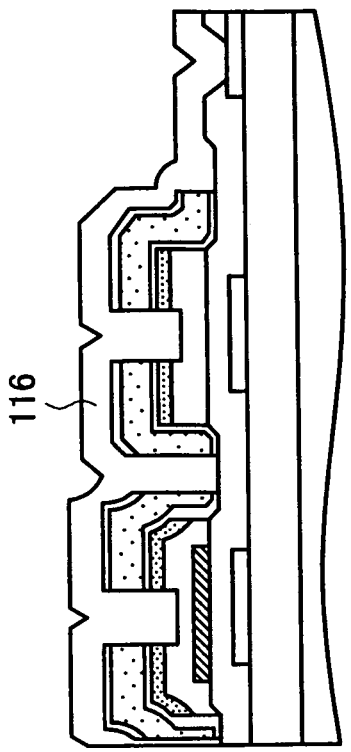
Figure 3G:
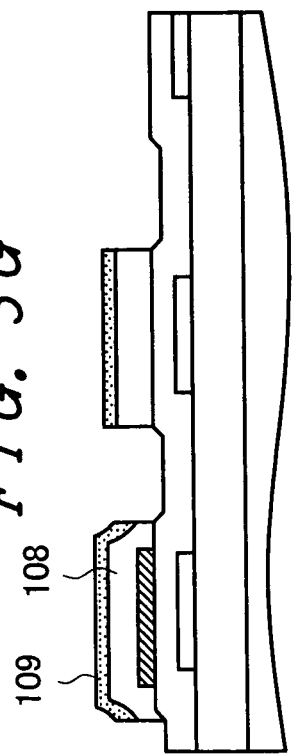
Figure 3H:
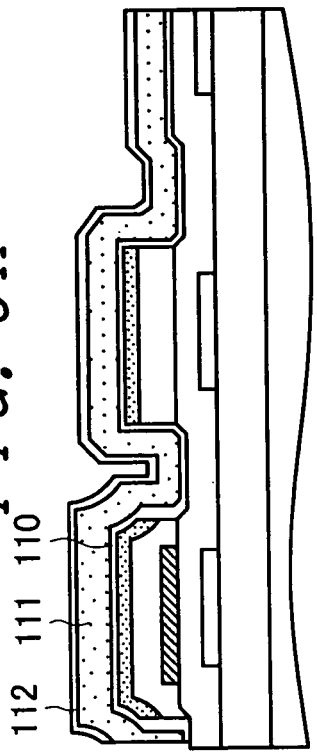
Figure 3I:
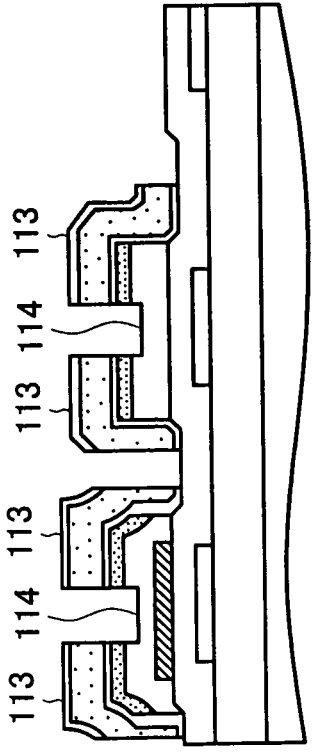

As shown in FIG. 3I, the SD electrode 113 is processed using a photolithography step and an etching step. Further, using the SD electrodes 113 as masks, the n+Si layers 109 each formed between a source and a drain of the TFT are removed by dry etching. Due to such a process, channel etching portions 114 are formed. Next, as shown in FIG. 3J, with respect to gate lines at the terminal portion, that is, with respect to the terminal-portion lines 130, through holes 115 are formed in the gate insulation film 104 by photo etching.

As shown in FIG. 3K, the whole TFT is covered with the passivation film 116 formed of a SiN film. The SiN film is formed using a plasma CVD method. Thereafter, as shown in FIG. 1, a photosensitive organic film 117 for leveling is applied to the passivation film 116 by coating, and is processed in a photolithography step. A film thickness of the organic film 117 is set to approximately 1 to 2 μm. Using the organic film 117 as a mask, the passivation film 116 formed of the SiN film is etched so as to form contact holes. Thereafter, the ITO film 119 for forming the pixel electrodes is formed on the organic film 117 by sputtering, and photo etching is applied to the ITO film 119 so as to form the pixel electrodes. Due to such processing, the constitution shown in FIG. 1 is acquired. That is, the TFT for drive circuit which forms the channel using the poly-Si layer 107 and the TFT for pixel which forms the channel using the a-Si layer 108 are simultaneously formed on the same substrate.

Figure 4A:
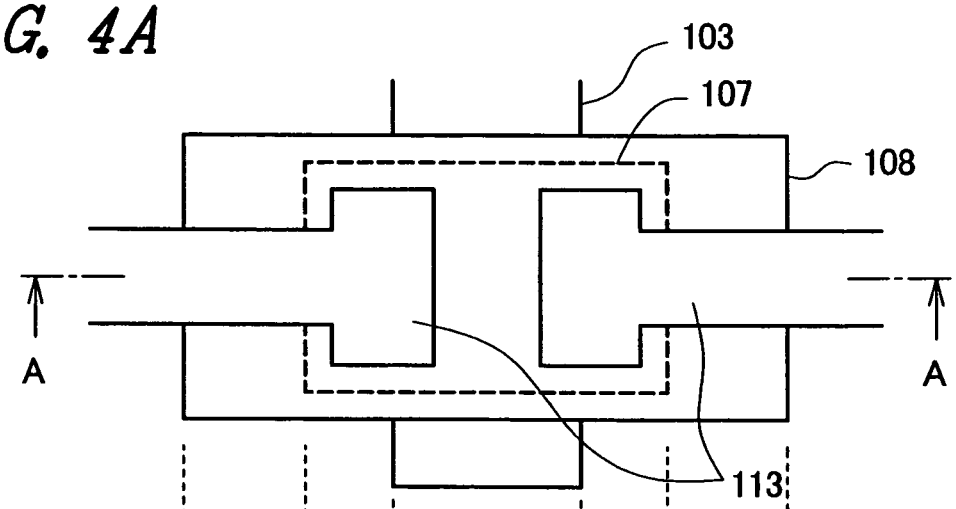
Figure 4B:
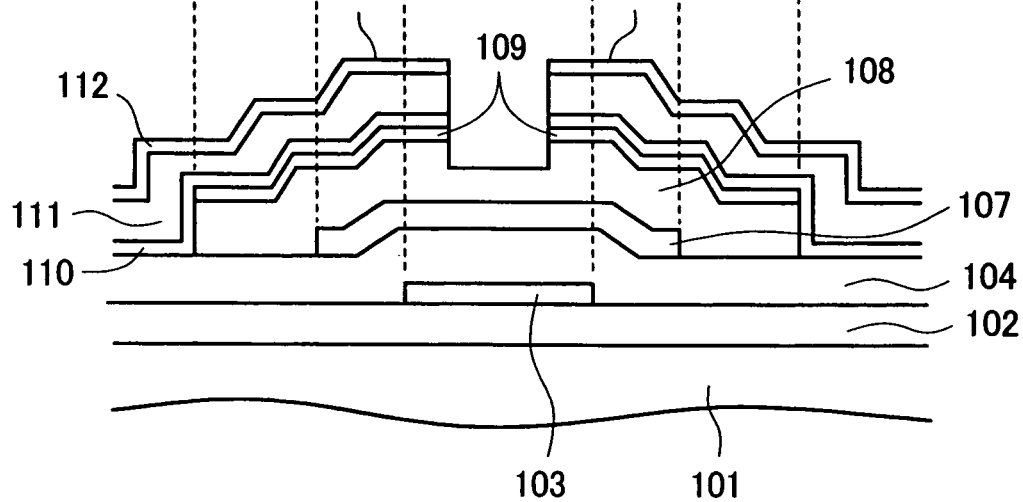

FIG. 4A and FIG. 4B are detailed views of an essential part of the TFT for drive circuit of this embodiment, wherein FIG. 4A is a plan view of the TFT for drive circuit, and FIG. 4B is a cross-sectional view taken along a line A-A in FIG. 4A. Although the constitution shown in FIG. 4B which is the cross-sectional view is substantially equal to the constitution explained in conjunction with FIG. 1, FIG. 2A to FIG. 2F and FIG. 3G to FIG. 3K, the relationship between the cross-sectional view and the plan view of the TFT is shown in FIG. 4A and FIG. 4B.

In FIG. 4A, a poly-Si layer 107 is formed on a gate electrode 103 by way of a gate insulation film 104, and the a-Si layer 108 is formed on the poly-Si layer 107 in a state that the a-Si layer 108 covers the poly-Si layer 107. In FIG. 4A, the poly-Si layer 107 indicated by a dotted line is completely covered with the a-Si layer 108. The poly-Si layer 107 is not in contact with an SD electrode 113. An n+Si layer 109 is formed on the a-Si layer 108, and the a-Si layer 108 is brought into contact with the SD electrode 113 by way of the n+Si layer 109.

As shown in FIG. 4B, side portions of the a-Si layer 108 are brought into contact with the SD electrode 113. In the constitution shown in FIG. 4A and FIG. 4B, when a positive voltage is applied to the gate electrode 103 for turning on the TFT, electrons are induced in the poly-Si layer 107, and a drain current flows corresponding to mobility of electrons. Here, the channel portion is formed of the poly-Si layer 107 and hence, mobility of electrons can be enhanced thus realizing a TFT which can perform a high-speed operation.

Figure 5:
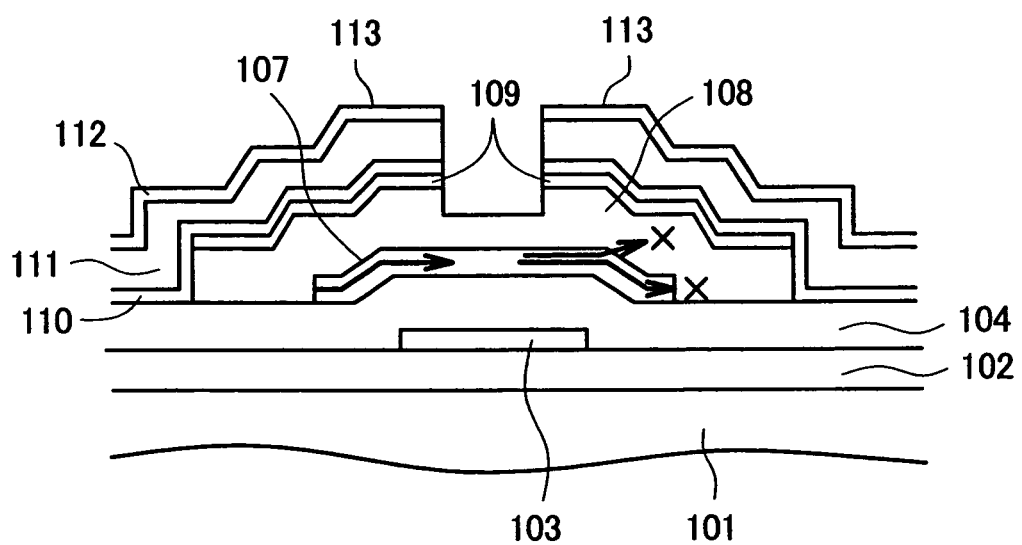
FIG. 5 is an operation view of the TFT of the embodiment 1.

FIG. 5 is a view showing a state of an electric current when a negative voltage is applied to the gate electrode 103 of the TFT in FIG. 4. When the negative voltage is applied to the gate electrode 103, holes are induced in the poly-Si layer 107 which forms the channel portion. The holes move in the direction indicated by arrows in the drawing due to a voltage applied between the source and the drain. Here, in the constitution of this embodiment shown in FIG. 5, although the holes induced in the poly-Si layer 107 are required to pass through the a-Si layer 108 to generate a drain current, substantially no holes are present in the a-Si layer 108 and hence, the holes induced in the poly-Si layer 107 cannot reach the SD electrode 113.

As shown in FIG. 5, as cases in which the holes induced in the channel layer formed of the poly-Si layer 107 may generate a drain current, there considered are two cases, that is, a case in which the holes are directed toward the SD electrode 113 by way of the n+Si layer 109 and a case in which the holes are directed toward the SD electrode 113 which is in contact with a side surface of the a-Si layer 108. In either cases, the holes are required to pass through the a-Si layer 108 and hence, a flow of an electric current induced in the holes cannot be generated. Accordingly, this embodiment can restrict an OFF current to a value substantially equal to an OFF current of a TFT which forms the channel using an a-Si film.

Figure 6:
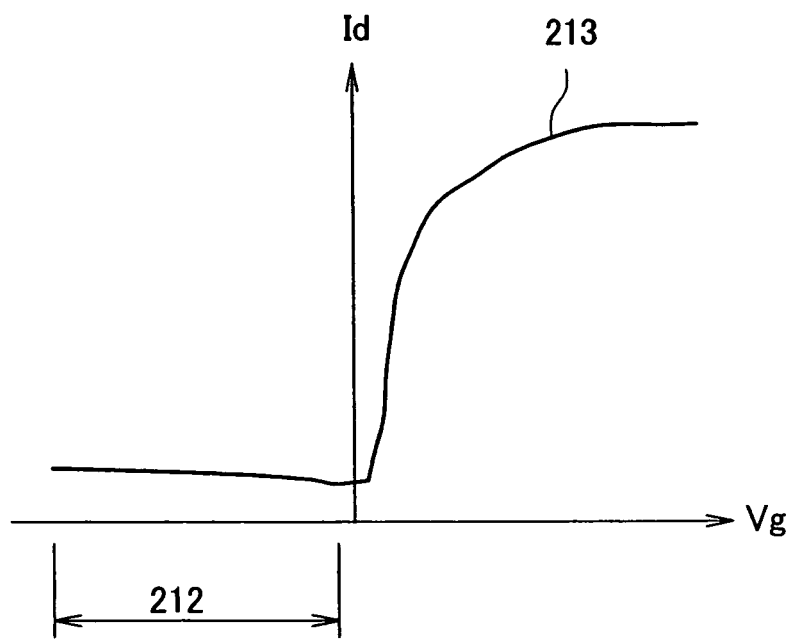
FIG. 6 is a graph showing the relationship between a gate voltage and a drain current of the TFT according to the present invention.

FIG. 6 is a graph showing a current-voltage characteristic when this embodiment is adopted. In FIG. 6, a voltage which is applied to the gate electrode 103 is taken on an axis of abscissas, while a drain current is taken on an axis of ordinates. When a positive voltage is applied to the gate electrode 103, electrons are induced in the poly-Si layer 107 and a drain current flows through the a-Si layer 108. Here, the channel portion is formed of the poly-Si layer 107 and hence, mobility of electrons is high thus realizing a high-speed operation. On the other hand, when a negative voltage is applied to the gate electrode 103, holes are induced in the channel formed of the poly-Si layer 107. However, the holes are blocked by the a-Si layer 108 and hence, a large current cannot be generated. Accordingly, as shown in FIG. 6, the OFF current can be restricted to a small value substantially equal to an OFF current of a TFT which forms a channel using the a-Si layer 108.

As has been explained heretofore, according to this embodiment, the a-Si bottom-gate-type TFT can be formed in the pixel portion, while the poly-Si bottom-gate-type TFT can be formed in the drive portion. In this embodiment, the channel of the TFT for drive portion can be formed of the poly-Si layer 107 and hence, mobility of electrons is high where by it is possible to acquire a TFT which can perform a high-speed operation. On the other hand, when the TFT of the drive part is turned off, an electric current is blocked by the a-Si layer 108 which covers the poly-Si layer 107 and hence, it is possible to restrict a leak current to a value substantially equal to a leak current of the TFT which forms the channel using the a-Si layer 108.

[Embodiment 2]

Figure 7A:
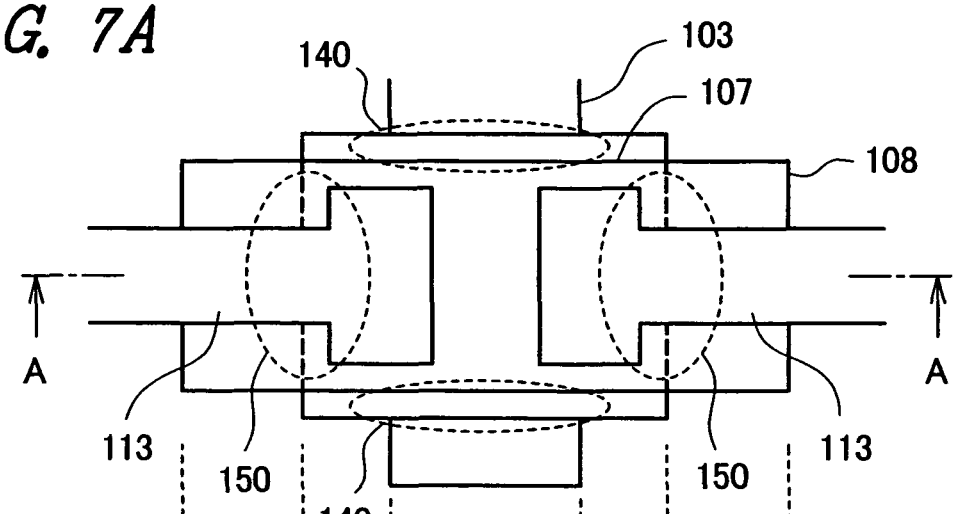
Figure 7B:
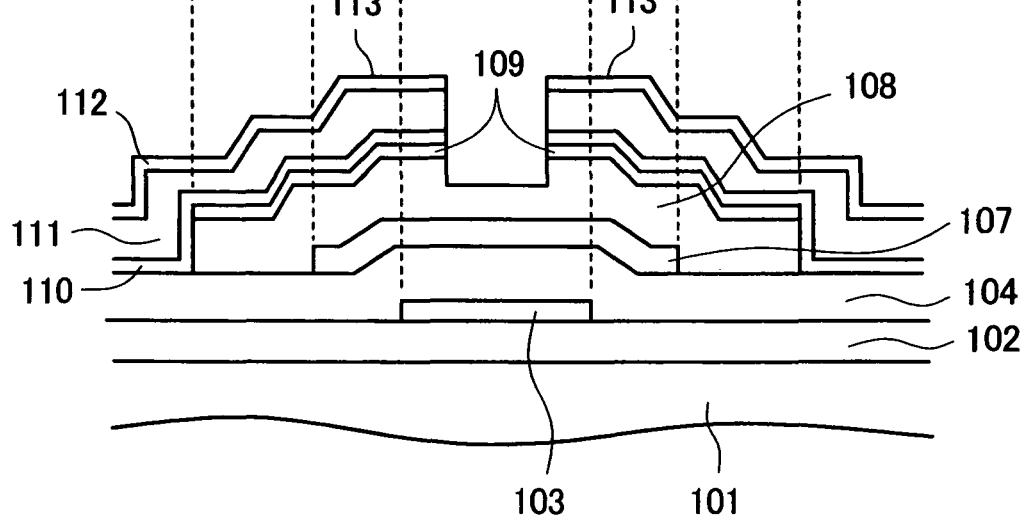

FIG. 7A and FIG. 7B show an essential part of a display device of an embodiment 2 of the present invention, wherein FIG. 7A is a plan view of a TFT for forming a drive circuit according to this embodiment, and FIG. 7B is a cross-sectional view taken along a line A-A in FIG. 7A. In FIG. 7A, with respect to left and right portions 150 of a poly-Si layer 107, an a-Si layer 108 has a width larger than a width of the poly-Si layer 107 in the same manner as the embodiment 1. Accordingly, FIG. 7B which is a cross-sectional view taken along a line A-A in FIG. 7A is substantially equal to FIG. 4B which is a cross-sectional view taken along a line A-A in FIG. 4A. That is, the poly-Si layer 107 is not in contact with an SD electrode 113.

With respect to upper and lower portions 140 of the poly-Si layer 107, the poly-Si layer 107 has a width larger than a width of the a-Si layer 108. However, on portions 140 of the a-Si layer 108 where the width of the a-Si layer 108 is larger than the width of the poly-Si layer 107, the SD electrode 113 is not formed. Accordingly, even when a negative voltage is applied to a gate electrode 103 so that holes are induced in the poly-Si layer 107, a drain current is not generated by the holes. Accordingly, even when the constitution of the TFT of this embodiment in which the channel is formed of the poly-Si layer 107 is adopted, in the same manner as the TFT which forms the channel using the a-Si layer 108, it is possible to restrict an OFF current to a small value. Accordingly, the gate voltage-drain current characteristic of the TFT according to this embodiment is substantially equal to the voltage-current characteristic explained in conjunction with FIG. 6.

As in the case of this embodiment explained heretofore, even when the specific portions of the poly-Si layer 107 are formed larger than the a-Si layer 108, it is possible to manufacture the TFT for drive circuit part which exhibits high mobility in an ON operation and exhibits a small leak current in an OFF operation using the bottom gate structure. Accordingly, it is possible to efficiently form the TFTs in each of which the channel is formed of the a-Si layer 108 in a display region as well as the TFTs in each of which the channel is formed of the poly-Si layer 107 in the drive circuit on the same substrate.

[Embodiment 3]

Figure 8A:
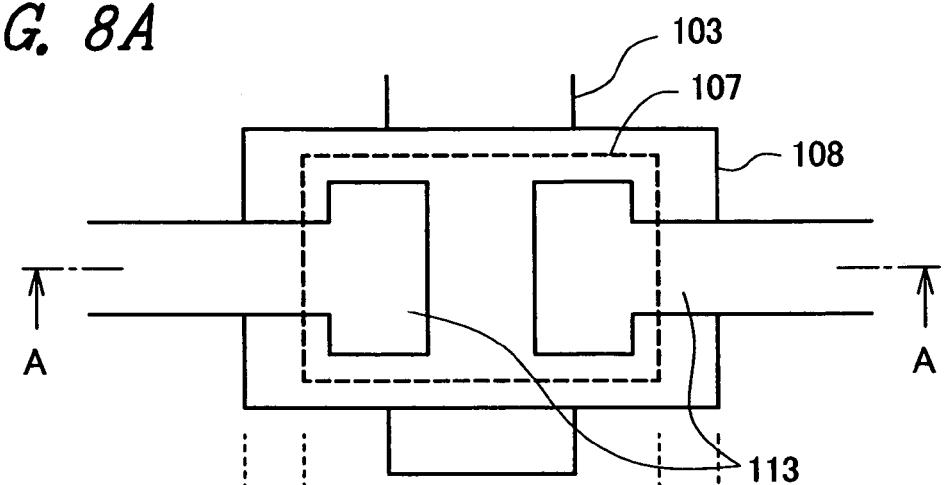
Figure 8B:
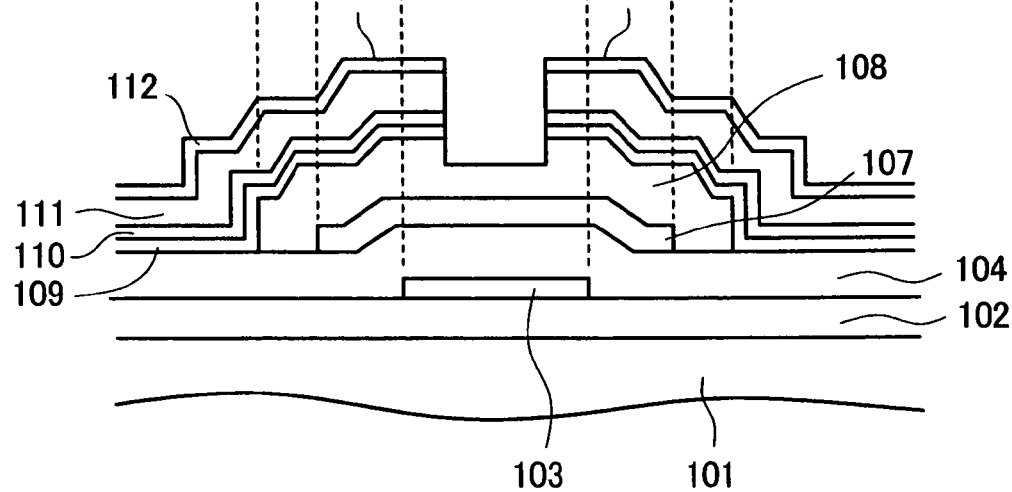
Figure 9A:
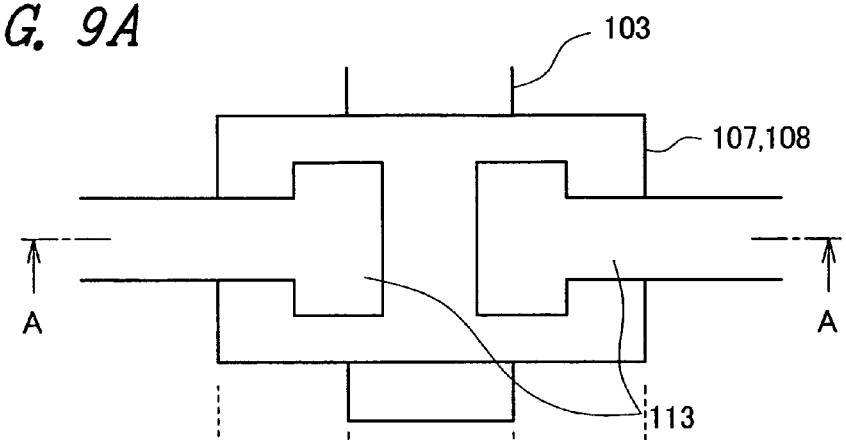
Figure 9B:
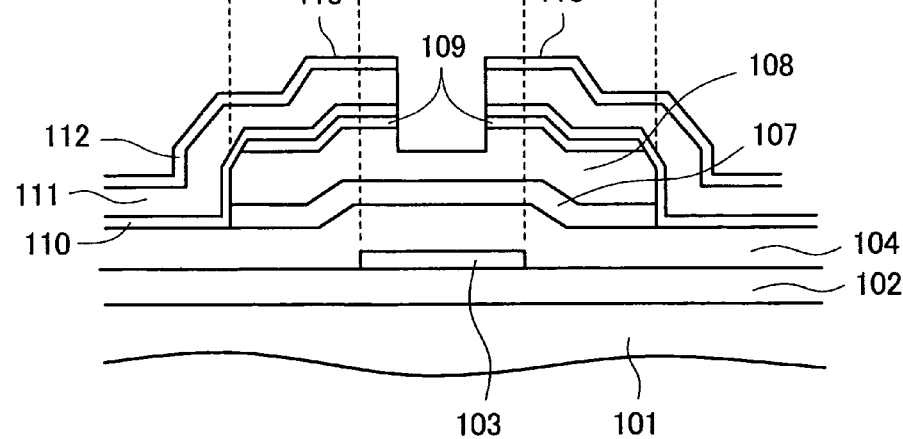

FIG. 8A and FIG. 8B show an essential part of a display device of an embodiment 3 of the present invention, wherein FIG. 8A is a plan view of the embodiment 3 and FIG. 8B is a cross-sectional view taken along a line A-A in FIG. 8A. In FIG. 8A, a poly-Si layer 107 is formed on a gate electrode 103 by way of a gate insulation film 104, and an a-Si layer 108 is formed on the poly-Si layer 107. In the same manner as the embodiment 1, the a-Si layer 108 completely covers the poly-Si layer 107. Further, in the same manner as the embodiment 1, an SD electrode 113 is formed on the a-Si layer 108 by way of an n+Si layer 109. In this embodiment, however, an area of the n+Si layer 109 differs from an area of the n+Si layer 109 of the embodiment 1.

FIG. 8B is a cross-sectional view taken along a line A-A in FIG. 8A. FIG. 8B is substantially equal to FIG. 4B which is used for explaining the embodiment 1 except for a region of the n+Si layer 109. The technical feature which makes the constitution shown in FIG. 8B different from the constitution shown in FIG. 4B lies in that the n+Si layer 109 is formed not only on the a-Si layer 108 but also within a range which is equal to a range within which an SD layer falls.

Due to the constitution shown in FIG. 8B, even at side portions of the a-Si layer 108, a potential barrier is formed between the n+Si layer 109 and the a-Si layer 108. The potential barrier performs a function of restricting a leak current of a TFT when the TFT is turned off. That is, the contact portion shown in FIG. 8B is substantially equal to the constitution of a contact portion of the usual TFT which forms the channel using the a-Si layer 108.

According to the constitution of the TFT explained in conjunction with FIG. 8B, even when a negative voltage is applied to a gate electrode so that holes are induced in the poly-Si layer 107, the holes are double-blocked and hence, it is possible to restrict a drain current to a small value. That is, first of all, the extremely small number of holes is present in the a-Si layer 108 and hence, it is possible to make the generation of a drain current extremely small. Further, at the upper portion and the side portions of the a-Si layer 108, it is possible to further restrict the leak current using the potential barrier formed between the a-Si layer 108 and the n+Si layer 109.

In the embodiment explained in conjunction with FIG. 8, the poly-Si layer 107 is completely covered with the a-Si layer 108. However, even when a portion of the poly-Si layer 107 may not be covered with the a-Si layer 108 as described in the embodiment 2, provided that the portion of the poly-Si layer 107 is not covered with the SD electrode 113, it is possible to acquire advantageous effects substantially equal to the advantageous effects of this embodiment. Here, the n+Si layer 109 is etched using the SD electrode 113 as a resist and hence, the SD electrode 113 and the n+Si layer 109 overlap with each other.

As in the case of this embodiment explained heretofore, the poly-Si layer 107 is covered with the a-Si layer 108 and, at the same time, the n+Si layer 109 is formed on the a-Si layer 108 in a state that the n+Si layer 109 also covers side surfaces of the a-Si layer 108. Accordingly, it is possible to manufacture the TFT for drive circuit part which exhibits high mobility in an ON operation and generates an extremely small leak current in OFF operation using the bottom gate structure. Accordingly, it is possible to efficiently form the TFTs in each of which the channel is formed of the a-Si layer 108 in a display region and the TFT which forms the channel using the poly-Si layer 107 in the drive circuit on the same substrate.

Heretofore, the explanation has been made by taking the liquid crystal display device as an example in the above-mentioned embodiments. However, a demand for realization of a display device incorporating the drive circuit therein with simplified processing by forming TFTs for pixels in the display region and the TFT for drive circuit formed around the display region using the bottom gate structure is not limited to the liquid crystal display device. For example, also in an organic EL display device, a manufacturing process of TFTs can be simplified by manufacturing TFTs for pixel portions and a TFT for forming a peripheral circuit part using the bottom gate structure. Further, it is needless to say that the present invention is applicable to a TFT for forming a drive circuit.

Here, the organic EL display device includes organic EL layers each of which is formed of a plurality of layers, wherein these organic EL layers correspond to pixel electrodes of the liquid crystal display device. The organic EL display device also includes a plurality of TFTs formed in pixel portions for driving the respective organic EL layers. The TFT in the pixel portion can be formed using a TFT which forms a channel using an a-Si layer 108. While a TFT for forming a drive circuit which is formed in the periphery of the display region can be formed using a bottom-gate-type TFT which forms a channel portion using the poly-Si layer 107 as explained in the embodiment 1 to the embodiment 3.

What is claimed is:

1. A display device comprising:
    a display region in which pixel electrodes and TFTs for pixel are formed in a matrix array; and
    a drive circuit which is formed in a periphery of the display region and includes a TFT for drive circuit, wherein
    the TFT for pixel is a bottom-gate-type TFT having a channel portion which is formed of an a-Si layer,
    the TFT for drive circuit is a bottom-gate-type TFT, the TFT for drive circuit is constituted by forming a channel portion using a poly-Si layer, by placing an a-Si layer on the poly-Si layer, by forming an n+Si layer on the a-Si layer, and by forming an SD electrode on the n+Si layer,
    a gate insulation film is formed on a gate electrode of the TFT for drive circuit,
    the poly-Si layer is formed on the gate insulation film and has a main surface and a side surface,
    the main surface faces the gate electrode of the TFT for drive circuit,
    the side surface intersects both the main surface and the gate insulation film and extends to contact the gate insulation film at an intersection point of the side surface and the gate insulation film,
    an entirety of the side surface is in contact with the a-Si layer of the TFT for drive circuit,
    the a-Si layer of the TFT for drive circuit covers the poly-Si layer including covering the side surface, and
    the poly-Si layer is not brought into contact with the SD electrode.

2. A display device according to claim 1, wherein the poly-Si layer is formed by applying laser annealing to the a-Si layer.

3. A display device according to claim 1, wherein a gate electrode of the bottom-gate-type TFT for the pixel and the gate electrode of the bottom-gate-type TFT for the drive circuit are made of Mo or Mo alloy.

4. A display device according to claim 1, wherein the SD electrode is constituted of a barrier metal layer, an Al layer and a cap metal layer, and the barrier metal layer and the cap metal layer are made of Mo or Mo alloy.

5. A display device comprising:
    a display region in which pixel electrodes and TFTs for pixel are formed in a matrix array; and
    a drive circuit which is formed in a periphery of the display region and includes a TFT for drive circuit, wherein
    the TFT for pixel is a bottom-gate-type TFT having a channel portion which is formed of an a-Si layer,
    the TFT for drive circuit is a bottom-gate-type TFT, the TFT for drive circuit is constituted by forming a channel portion using a poly-Si layer, by placing an a-Si layer on the poly-Si layer, by forming an n+Si layer on an upper portion and a side portion of the a-Si layer, and by forming an SD electrode on the n+Si layer,
    a gate insulation film is formed on a gate electrode of the TFT for drive circuit,
    the poly-Si layer is formed on the gate insulation film and has a main surface and a side surface,
    the main surface faces the gate electrode of the TFT for drive circuit,
    the side surface intersects both the main surface and the gate insulation film and extends to contact the gate insulation film at an intersection point of the side surface and the gate insulation film,
    an entirety of the side surface is in contact with the a-Si layer of the TFT for drive circuit,
    the a-Si layer of the TFT for drive circuit covers the poly-Si layer including covering the side surface, and
    the poly-Si layer is not brought into contact with the n+Si layer.

6. A display device according to claim 5, wherein the poly-Si layer is formed by applying laser annealing to the a-Si layer.

7. A display device according to claim 5, wherein a gate electrode of the bottom-gate-type TFT for the pixel and the gate electrode of the bottom-gate-type TFT for the drive circuit are made of Mo or Mo alloy.

8. A display device according to claim 5, wherein the SD electrode is constituted of a barrier metal layer, an Al layer and a cap metal layer, and the barrier metal and the cap metal are made of Mo or Mo alloy.

9. A liquid crystal display device comprising:
    a TFT substrate which forms a display region in which pixel electrodes and TFTs for pixel are formed in a matrix array and a drive circuit which includes a TFT for drive circuit in a periphery of the display region thereon;
    a color filter substrate which faces the TFT substrate in an opposed manner and forms color filters on portions thereof corresponding to the pixel electrodes; and
    liquid crystal which is sandwiched between the TFT substrate and the color filter substrate; wherein the TFT for pixel is a bottom-gate-type TFT having a channel portion which is formed of an a-Si layer, the TFT for drive circuit is a bottom-gate-type TFT, the TFT for drive circuit is constituted by forming a channel portion using a poly-Si layer, by placing an a-Si layer on the poly-Si layer, by forming an n+Si layer on the a-Si layer, and by forming an SD electrode on the n+Si layer, a gate insulation film is formed on a gate electrode of the TFT for drive circuit, the poly-Si layer is formed on the gate insulation film and has a main surface and a side surface, the main surface faces the gate electrode of the TFT for drive circuit, the side surface intersects both the main surface and the gate insulation film and extends to contact the gate insulation film at an intersection point of the side surface and the gate insulation film, an entirety of the side surface is in contact with the a-Si layer of the TFT for drive circuit, the a-Si layer of the TFT for drive circuit covers the poly-Si layer including covering the side surface, and the poly-Si layer is not brought into contact with the SD electrode.

10. A liquid crystal display device according to claim 9, wherein a side portion of the a-Si layer is also covered with the n+Si layer.

11. An organic EL display device including a TFT substrate which forms a display region in which organic EL layers and TFTs for pixel are formed in a matrix array and a drive circuit which includes a TFT for drive circuit in a periphery of the display region thereon, wherein the TFT for pixel is a bottom-gate-type TFT having a channel portion which is formed of an a-Si layer, the TFT for drive circuit is a bottom-gate-type TFT, the TFT for drive circuit is constituted by forming a channel portion using a poly-Si layer, by placing an a-Si layer on the poly-Si layer, by forming an n+Si layer on the a-Si layer, and by forming an SD electrode on the n+Si layer, a gate insulation film is formed on a gate electrode of the TFT for drive circuit, the poly-Si layer is formed on the gate insulation film and has a main surface and a side surface, the main surface faces the gate electrode of the TFT for drive circuit, the side surface intersects both the main surface and the gate insulation film and extends to contact the gate insulation film at an intersection point of the side surface and the gate insulation film, an entirety of the side surface is in contact with the a-Si layer of the TFT for drive circuit, the a-Si layer of the TFT for drive circuit covers the poly-Si layer including covering the side surface, and the poly-Si layer is not brought into contact with the SD electrode.

12. An organic EL display device according to claim 11, wherein a side portion of the a-Si layer is also covered with the n+Si layer.

13. A display device comprising:

a display region in which pixel electrodes and TFTs for pixel are formed in a matrix array; and a drive circuit which is formed in a periphery of the display region and includes a TFT for drive circuit, wherein the TFT for pixel is a bottom-gate-type TFT having a channel portion which is formed of an a-Si layer, the TFT for drive circuit is a bottom-gate-type TFT, the TFT for drive circuit is constituted by forming a channel portion using a strip-shaped crystal silicon layer, by placing an a-Si layer on the strip-shaped crystal silicon layer, by forming an n+Si layer on the a-Si layer, and by forming an SD electrode on the n+Si layer, a gate insulation film is formed on a gate electrode of the TFT for drive circuit, the strip-shaped crystal silicon layer is formed on the gate insulation film and has a main surface and a side surface, the main surface faces the gate electrode of the TFT for drive circuit, the side surface intersects both the main surface and the gate insulation film and extends to contact the gate insulation film at an intersection point of the side surface and the gate insulation film, an entirety of the side surface is in contact with the a-Si layer of the TFT for drive circuit, the a-Si layer of the TFT for drive circuit covers the strip-shaped crystal silicon layer including covering the side surface, and the strip-shaped crystal silicon layer is not brought into contact with the SD electrode.

* * * * *